United States Patent
Cui et al.

(10) Patent No.: US 11,791,352 B2
(45) Date of Patent: Oct. 17, 2023

(54) DISPLAY PANEL AND DISPLAY DEVICE

(71) Applicant: SHENZHEN CHINA STAR OPTOELECTRONICS SEMICONDUCTOR DISPLAY TECHNOLOGY CO., LTD., Shenzhen (CN)

(72) Inventors: Wei Cui, Shenzhen (CN); Miao Jiang, Shenzhen (CN); Jiangbo Yao, Shenzhen (CN); Lixuan Chen, Shenzhen (CN); Xin Zhang, Shenzhen (CN)

(73) Assignee: SHENZHEN CHINA STAR OPTOELECTRONICS SEMICONDUCTOR DISPLAY TECHNOLOGY CO., LTD., Shenzhen (CN)

( * ) Notice: Subject to any disclaimer, the term of this patent is extended or adjusted under 35 U.S.C. 154(b) by 301 days.

(21) Appl. No.: 17/057,663

(22) PCT Filed: Oct. 30, 2020

(86) PCT No.: PCT/CN2020/125198
§ 371 (c)(1),
(2) Date: Nov. 21, 2020

(87) PCT Pub. No.: WO2022/047974
PCT Pub. Date: Mar. 10, 2022

(65) Prior Publication Data
US 2022/0310672 A1    Sep. 29, 2022

(30) Foreign Application Priority Data
Sep. 1, 2020    (CN) .......................... 202010906002.2

(51) Int. Cl.
*H01L 27/144*    (2006.01)
*G06F 3/042*    (2006.01)
(Continued)

(52) U.S. Cl.
CPC ........ *H01L 27/1443* (2013.01); *G06F 3/0421* (2013.01); *H01L 27/1446* (2013.01);
(Continued)

(58) Field of Classification Search
CPC ............. H01L 27/1443; H01L 27/1446; H01L 27/3227; H01L 31/1013; H01L 31/1136;
(Continued)

(56) References Cited

U.S. PATENT DOCUMENTS

2008/0158461 A1*  7/2008  Kenmochi ............ G06F 3/0412
                                                        349/48
2011/0156184 A1   6/2011  Ninkov et al.
(Continued)

FOREIGN PATENT DOCUMENTS

CN    101923065 A    12/2010
CN    103218085 A    7/2013
(Continued)

OTHER PUBLICATIONS

Highly Transparent, Visible-Light Photodector Based on Oxide Semiconductors and Quantum Dots, Seung Won Shin et al., ACS Applied Materials & Interfaces, pp. 19666-19671 (Year: 2015).*
(Continued)

*Primary Examiner* — Patrick N Edouard
*Assistant Examiner* — Joseph P Fox
(74) *Attorney, Agent, or Firm* — PV IP PC; Wei Te Chung; Zhigang Ma

(57) ABSTRACT

The present application provides a display panel and a display device. The display panel includes a plurality of light-sensing circuits and a position detection circuit. The plurality of light-sensing circuits are disposed in the display panel and are arranged in an array. Each of the plurality of light-sensing circuits includes a light-sensing transistor. The present application disposes a quantum dot layer, which can
(Continued)

absorb interactive light and convert its light intensity signal into an electrical signal, and determines an irradiation position of the interactive light through the position detection circuit, so that an interaction with light with a longer wavelength can be realized.

18 Claims, 2 Drawing Sheets

(51) Int. Cl.
  *H01L 31/101* (2006.01)
  *H01L 31/113* (2006.01)
  *H10K 59/60* (2023.01)
(52) U.S. Cl.
  CPC ...... *H01L 31/1013* (2013.01); *H01L 31/1136* (2013.01); *H10K 59/60* (2023.02)
(58) Field of Classification Search
  CPC .......... H01L 31/035218; H01L 31/055; H01L 31/0336; G06F 3/0421; G06F 3/0412; G06F 2203/04103; G06F 3/042
  See application file for complete search history.

(56) References Cited

U.S. PATENT DOCUMENTS

| | | | | |
|---|---|---|---|---|
| 2014/0098064 | A1* | 4/2014 | Lien | G06F 3/04186 345/175 |
| 2018/0120614 | A1* | 5/2018 | Shin | G02F 1/13306 |

FOREIGN PATENT DOCUMENTS

| | | |
|---|---|---|
| CN | 105304651 A | 2/2016 |
| CN | 108010493 A | 5/2018 |
| CN | 108846392 A | 11/2018 |
| KR | 20150072888 A | 6/2015 |

OTHER PUBLICATIONS

Seung, Won Shin, Highly Transparent, Visible-Light Photodetector Based on Oxide Semiconductors and Quantum Dots, ACS Applied. (Aug. 21, 2015) p. 19666.

Chinese Office Action issued in corresponding Chinese Patent Application No. 202010906002.2 dated Jun. 15, 2023, pp. 1-7.

* cited by examiner

DISPLAY PANEL AND DISPLAY DEVICE

RELATED APPLICATIONS

This application is a Notional Phase of PCT Patent Application No. PCT/CN2020/125198 having international filing date of Oct. 30, 2020, which claims the benefit of priority of Chinese Patent Application No. 202010906002.2 filed on Sep. 1, 2020. The contents of the above applications are all incorporated by reference as if fully set forth herein in their entirety.

FIELD OF INVENTION

The present application is related to the field of display technology, and specifically, to a display panel and a display device.

BACKGROUND OF INVENTION

With development of display technology, display devices with interactive functions have attracted more and more attention. Compared with traditional polysilicon transistors, metal oxide transistors have higher electron mobility and stability, so they are widely used in current display panels. However, metal oxide active layers in the metal oxide transistors have a wider bandwidth, so they only have an absorption effect on ultraviolet light with a shorter wavelength but do not absorb visible light and near-infrared light, which makes the metal oxide transistors unsuitable for visible light or near-infrared light sensors, thereby greatly limiting interactive functions of the display panels composed of the metal oxide transistors in the visible light or the near-infrared light.

Therefore, the current display panels have a technical problem of a narrow wavelength range of interactive light, which needs to be solved.

SUMMARY OF INVENTION

The present application provides a display panel and a display device to alleviate a technical problem of a narrow wavelength range of interactive light of current display panels.

In order to solve the above problem, the present application provides the following technical solutions.

The present application provides a display panel, including:

a plurality of light-sensing regions arranged in an array; a light-sensing circuit disposed in each of the plurality of light-sensing regions, wherein the light-sensing circuit includes a light-sensing transistor, the light-sensing transistor includes a substrate, a metal oxide active layer, a gate layer, a gate insulating layer, a source/drain layer, and a quantum dot layer, the quantum dot layer is in contact with the metal oxide active layer, the quantum dot layer is configured to absorb interactive light emitted by an interactive light source, a wavelength of the interactive light is greater than a maximum absorption wavelength of the metal oxide active layer, and the light-sensing transistor is configured to convert a light intensity signal of the interactive light into an electrical signal; and a position detection circuit electrically connected to the light-sensing circuit and configured to determine an irradiation position of the interactive light according to the electrical signal.

In the display panel of the present application, the quantum dot layer includes cadmium selenide quantum dots.

In the display panel of the present application, the light-sensing transistor includes the substrate, the gate layer, the gate insulating layer, the metal oxide active layer, and the source/drain layer, which are stacked; and the quantum dot layer is disposed on at least one of a side of the metal oxide active layer adjacent to the gate insulating layer or a side of the metal oxide active layer adjacent to the source/drain layer.

In the display panel of the present application, the light-sensing transistor includes the substrate, the metal oxide active layer, the gate insulating layer, the gate layer, an interlayer insulating layer, and the source/drain layer, which are stacked; and the quantum dot layer is disposed on at least one of a side of the metal oxide active layer adjacent to the substrate or a side of the metal oxide active layer adjacent to the gate insulating layer.

In the display panel of the present application, material of the gate layer includes a transparent conductive material.

In the display panel of the present application, material of the metal oxide active layer includes at least one of indium-tin oxide, indium-zinc oxide, indium-gallium-zinc oxide, indium-zinc-tin oxide, or indium-gallium-zinc-tin oxide.

In the display panel of the present application, a projection of the metal oxide active layer on the substrate is positioned in a projection of the quantum dot layer on the substrate.

In the display panel of the present application, the light-sensing circuit further includes a first switching transistor; a gate of the light-sensing transistor is connected to a scan signal line, a first electrode of the light-sensing transistor is connected to a power high electric potential signal line, and a second electrode of the light-sensing transistor is connected to a gate of the first switching transistor; and a first electrode of the first switching transistor is connected to the power high electric potential signal line, a second electrode of the first switching transistor is connected to an electrical signal reading line, and the electrical signal reading line is connected to the position detection circuit.

In the display panel of the present application, the light-sensing circuit further includes a second switching transistor and a storage capacitor; a gate of the light-sensing transistor is connected to a scan signal line, a first electrode of the light-sensing transistor is connected to a first data signal line, and a second electrode of the light-sensing transistor is connected to a first electrode of the second switching transistor; a gate of the second switching transistor is connected to a second data signal line, and a second electrode of the second switching transistor is connected to an electrical signal reading line; and a first plate of the storage capacitor is connected to the first data signal line, a second plate of the storage capacitor is connected to the second electrode of the light-sensing transistor, and the electrical signal reading line is connected to the position detection circuit.

In the display panel of the present application, the position detection circuit includes an integrator.

In the display panel of the present application, the display panel includes an array substrate, and the light-sensing circuit is disposed in the array substrate.

In the display panel of the present application, a light-sensing layer is formed with a plurality of light-sensing circuits, and the light-sensing layer is disposed on a light-emitting surface of the display panel and is electrically connected to the display panel.

In the display panel of the present application, each of the plurality of light-sensing regions corresponds to one or more pixels.

In the display panel of the present application, the display panel includes a liquid crystal display panel or an organic light-emitting diode (OLED) display panel.

The present application further provides a display device, including a display panel and a driving chip. The display panel includes:

a light-sensing circuit disposed in each of a plurality of light-sensing regions, wherein the light-sensing circuit includes a light-sensing transistor, the light-sensing transistor includes a substrate, a metal oxide active layer, a gate layer, a gate insulating layer, a source/drain layer, and a quantum dot layer, the quantum dot layer is in contact with the metal oxide active layer, the quantum dot layer is configured to absorb interactive light emitted by an interactive light source, a wavelength of the interactive light is greater than a maximum absorption wavelength of the metal oxide active layer, and the light-sensing transistor is configured to convert a light intensity signal of the interactive light into an electrical signal; and a position detection circuit electrically connected to the light-sensing circuit and configured to determine an irradiation position of the interactive light according to the electrical signal.

In the display device of the present application, the quantum dot layer includes cadmium selenide quantum dots.

In the display device of the present application, the light-sensing transistor includes the substrate, the gate layer, the gate insulating layer, the metal oxide active layer, and the source/drain layer, which are stacked; and the quantum dot layer is disposed on at least one of a side of the metal oxide active layer adjacent to the gate insulating layer or a side of the metal oxide active layer adjacent to the source/drain layer.

In the display device of the present application, the light-sensing transistor includes the substrate, the metal oxide active layer, the gate insulating layer, the gate layer, an interlayer insulating layer, and the source/drain layer, which are stacked; and the quantum dot layer is disposed on at least one of a side of the metal oxide active layer adjacent to the substrate or a side of the metal oxide active layer adjacent to the gate insulating layer.

In the display device of the present application, the light-sensing circuit further includes a first switching transistor; a gate of the light-sensing transistor is connected to a scan signal line, a first electrode of the light-sensing transistor is connected to a power high electric potential signal line, and a second electrode of the light-sensing transistor is connected to a gate of the first switching transistor; and a first electrode of the first switching transistor is connected to the power high electric potential signal line, a second electrode of the first switching transistor is connected to an electrical signal reading line, and the electrical signal reading line is connected to the position detection circuit.

In the display device of the present application, the light-sensing circuit further includes a second switching transistor and a storage capacitor; a gate of the light-sensing transistor is connected to a scan signal line, a first electrode of the light-sensing transistor is connected to a first data signal line, and a second electrode of the light-sensing transistor is connected to a first electrode of the second switching transistor; a gate of the second switching transistor is connected to a second data signal line, and a second electrode of the second switching transistor is connected to an electrical signal reading line; and a first plate of the storage capacitor is connected to the first data signal line, a second plate of the storage capacitor is connected to the second electrode of the light-sensing transistor, and the electrical signal reading line is connected to the position detection circuit.

Beneficial effects of the present application are as follows. The present application provides the display panel and the display device. The plurality of light-sensing circuits are arranged in an array in the display panel. The light-sensing circuit includes the light-sensing transistor. The light-sensing transistor includes the substrate, the metal oxide active layer, the gate layer, the source/drain layer, and the quantum dot layer. The quantum dot layer is in contact with the metal oxide active layer. The quantum dot layer is configured to absorb the interactive light emitted by the interactive light source. The wavelength of the interactive light is greater than the maximum absorption wavelength of the metal oxide active layer. The light-sensing transistor is configured to convert the light intensity signal of the interactive light into the electrical signal. The position detection circuit is electrically connected to the light-sensing circuit and is configured to determine the irradiation position of the interactive light according to the electrical signal. The present application disposes the quantum dot layer, which is in contact with the metal oxide active layer, in the light-sensing transistor to absorb the interactive light with a longer wavelength and convert its light intensity signal into the electrical signal, and followed by determining the irradiation position of the interactive light through the position detection circuit. Therefore, an interaction with the light with a longer wavelength can be realized, and the current technical problem of the narrow wavelength range of the interactive light is alleviated.

DESCRIPTION OF DRAWINGS

In order to describe technical solutions in the present application clearly, drawings to be used in the description of embodiments will be described briefly below. Obviously, drawings described below are only for some embodiments of the present application, and other drawings can be obtained by those skilled in the art based on these drawings without creative efforts.

DETAILED DESCRIPTION OF PREFERRED EMBODIMENTS

Figure 1:
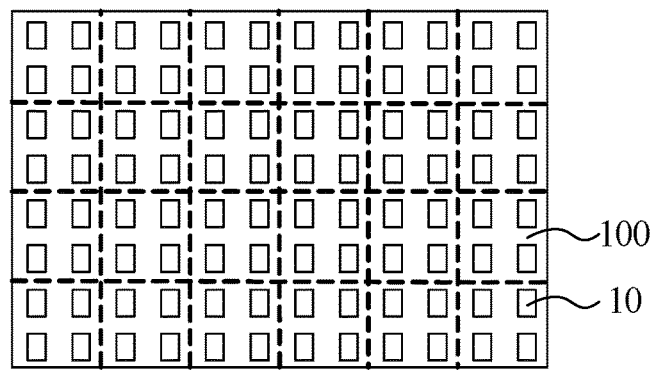
FIG. 1 is a schematic diagram of a planar structure of a display panel provided by an embodiment of the present application.

Examples are described below with reference to the appended drawings, and the drawings illustrate particular embodiments in which the present application may be practiced. Directional terms mentioned in the present application, such as upper, lower, front, rear, left, right, in, out, side, etc., only refer to directions in the accompanying drawings. Thus, the adoption of directional terms is used to describe and understand the present application, but not to limit the present application. In the drawings, units of similar structures are using the same numeral to represent.

The present application provides a display panel and a display device to alleviate a technical problem of a narrow wavelength range of interactive light of current display panels.

As shown in FIG. 1, the display panel provided by the present application includes a plurality of light-sensing regions 100 arranged in an array. The display panel includes a light-sensing circuit and a position detection circuit. The light-sensing circuit is disposed in each of the plurality of light-sensing regions 100. The light-sensing circuit includes a light-sensing transistor. The light-sensing transistor includes a substrate, a metal oxide active layer, a gate layer, a source/drain layer, and a quantum dot layer. The quantum dot layer is in contact with the metal oxide active layer. The quantum dot layer is configured to absorb interactive light emitted by an interactive light source. A wavelength of the interactive light is greater than a maximum absorption wavelength of the metal oxide active layer. The light-sensing transistor is configured to convert a light intensity signal of the interactive light into an electrical signal. The position detection circuit is electrically connected to the light-sensing circuit and is configured to determine an irradiation position of the interactive light according to the electrical signal.

The display panel includes a display region and a non-display region. The display region is provided with a plurality of pixels 10, which are arranged in an array. The light-sensing regions 100 are disposed in the display region and are arranged in an array as well. Each of the light-sensing regions 100 has a same size and shape. Each of the light-sensing regions 100 corresponds to one or more pixels 10. A size of each of the light-sensing regions 100 can be determined according to a size of the interactive light irradiated to the display panel. When a number of pixels 10 corresponding to the light sensing regions 100 is less, a sensing accuracy is higher, and an interaction effect is better.

The interactive light source is usually a laser pointer, or other devices that can emit the interactive light. The interactive light emitted by the interactive light source has a longer wavelength, which is greater than a maximum absorption wavelength of the metal oxide active layer 14. The interactive light can be visible light or near-infrared light.

The light-sensing circuit is disposed in each of the light-sensing regions 100, which means that each of the light-sensing regions 100 is provided with a light-sensing circuit. Each light-sensing circuit includes a light-sensing transistor. When the interactive light of the interactive light source is irradiated on the light-sensing transistor in one of the light-sensing regions 100, the light-sensing transistor converts the light intensity signal of the interactive light into the electrical signal. The electrical signal is generated in an irradiated one of the light-sensing regions 100, and no electrical signals are generated in an unirradiated one of the light-sensing regions 100. Because only one interactive light is emitted at the same time, the position detection circuit can determine the irradiation position of the interactive light according to the generated electrical signal.

In actual irradiation, the interactive light may irradiate several adjacent light-sensing regions 100 at the same time, and electrical signals are generated in these light-sensing regions 100. However, light intensities received by each of the light-sensing regions 100 are different, so magnitudes of the generated electrical signals are also different. The greater a light irradiation area, the greater the electrical signal generated, meanwhile, the position detection circuit can use the one of the light-sensing regions 100 that generates the greatest electrical signal as the irradiation position of the interactive light.

Figure 2:
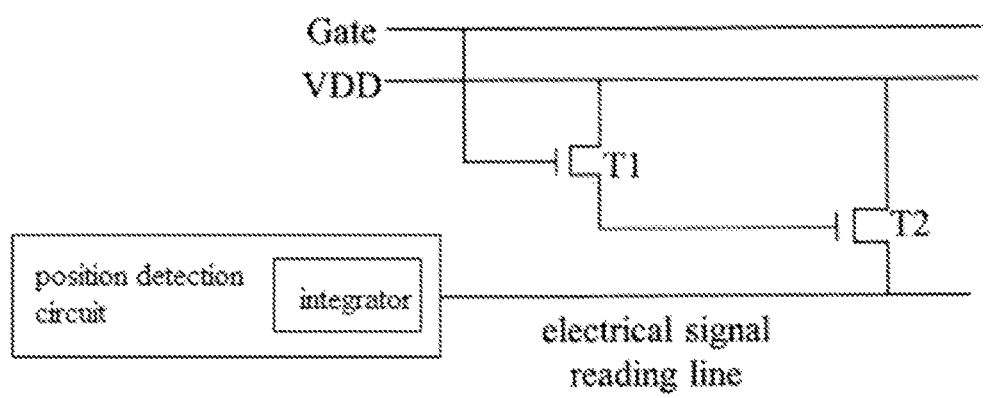
FIG. 2 is a first structural schematic diagram of a light-sensing circuit in the display panel provided by an embodiment of the present application.

As shown in FIG. 2, which is a first structural schematic diagram of the light-sensing circuit in the display panel provided by an embodiment of the present application, the light-sensing circuit includes the light-sensing transistor T1 and a first switching transistor T2. A gate of the light-sensing transistor T1 is connected to a scan signal line Gate. A first electrode of the light-sensing transistor T1 is connected to a power high electric potential signal line VDD. A second electrode of the light-sensing transistor T1 is connected to a gate of the first switching transistor T2. A first electrode of the first switching transistor T2 is connected to the power high electric potential signal line VDD. A second electrode of the first switching transistor T2 is connected to an electrical signal reading line. The electrical signal reading line is connected to the position detection circuit. Among the first electrode and the second electrode of each of these transistors, one is a source and the other is a drain.

When the light-sensing circuit is working, the scan signal line Gate inputs a negative voltage to the gate of the light-sensing transistor T1, and the power high electric potential signal line VDD inputs a positive voltage to the first electrode of the light-sensing transistor T1. When there is no light irradiating, the light-sensing transistor T1 is turned off, no signal is output to the first switching transistor T2, and the first switching transistor T2 is also turned off. After the interactive light source emits the interactive light, the interactive light is irradiated on the light-sensing transistor T1, the light-sensing transistor T1 is turned on, and the power high electric potential signal line VDD is input to the gate of the first switching transistor T2, so that the first switching transistor T2 is also turned on. The electrical signal reading line can read a voltage value in the power high electric potential signal line VDD, and the electrical signal reading line is connected to the position detection circuit, so that the position detection circuit can determine the position of the interactive light according to the voltage value read by the electrical signal reading line.

In an embodiment, the position detection circuit includes an integrator, which integrates a current flowing through and determines the position of the interactive light according to an integration result.

Figure 4:
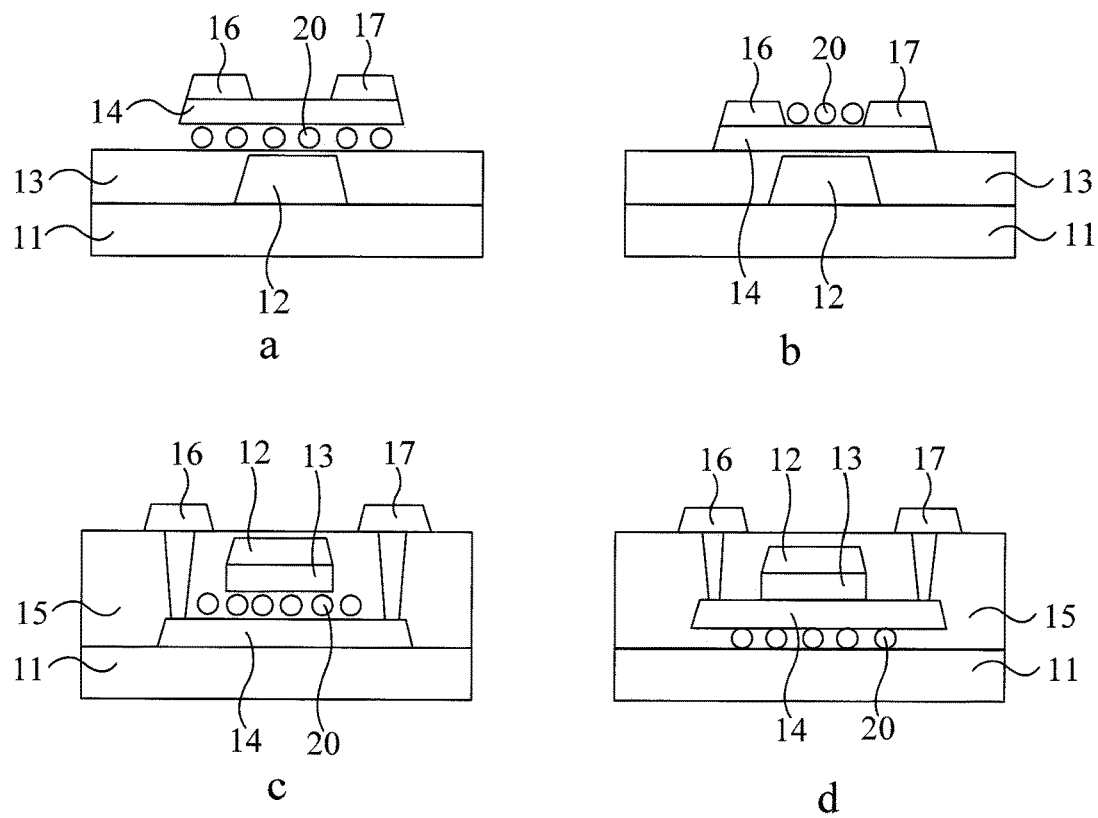
FIG. 4 is a structural schematic diagram of a light-sensing transistor in the display panel provided by an embodiment of the present application.

FIG. 4 shows four structural diagrams of the light-sensing transistor T1. The light-sensing transistor T1 includes the substrate 11, the metal oxide active layer 14, the gate layer 12, the source/drain layer, and the quantum dot layer 20. The quantum dot layer 20 is in contact with the metal oxide active layer 14. The quantum dot layer 20 is configured to absorb the interactive light emitted by the interactive light source. The light-sensing transistor T1 is configured to convert the light intensity signal of the interactive light into the electrical signal.

In an embodiment, the light-sensing transistor T1 is a bottom gate structure. As shown in FIGS. 4a and 4b, the light-sensing transistor T1 includes the substrate 11, the gate layer, a gate insulating layer 13, the metal oxide active layer 14, and the source/drain layer, which are stacked. The gate layer is patterned to form the gate 12 of the light-sensing transistor T1. The source/drain layer is patterned to form the source 16 and the drain 17 of the light-sensing transistor T1. The quantum dot layer 20 is disposed on at least one of a side of the metal oxide active layer 14 adjacent to the gate insulating layer 13 or a side of the metal oxide active layer 14 adjacent to the source/drain layer.

In an embodiment, the light-sensing transistor T1 is a top gate structure. As shown in FIGS. 4c and 4d, the light-sensing transistor T1 includes the substrate 11, the metal oxide active layer 14, the gate insulating layer 13, the gate layer, an interlayer insulating layer 15, and the source/drain layer, which are stacked. The gate layer is patterned to form the gate 12 of the light-sensing transistor T1. The source/drain layer is patterned to form the source 16 and the drain 17 of the light-sensing transistor T1. The quantum dot layer 20 is disposed on at least one of a side of the metal oxide active layer 14 adjacent to the substrate 11 or a side of the metal oxide active layer 14 adjacent to the gate insulating layer 13.

The quantum dot layer 20 includes quantum dots. Based on nano confinement effects, the quantum dots have a very narrow bandwidth and high color purity, which can greatly expand a color gamut of the display panel. Meanwhile, the quantum dots can adjust absorption of visible light by adjusting their sizes.

Figure 5:
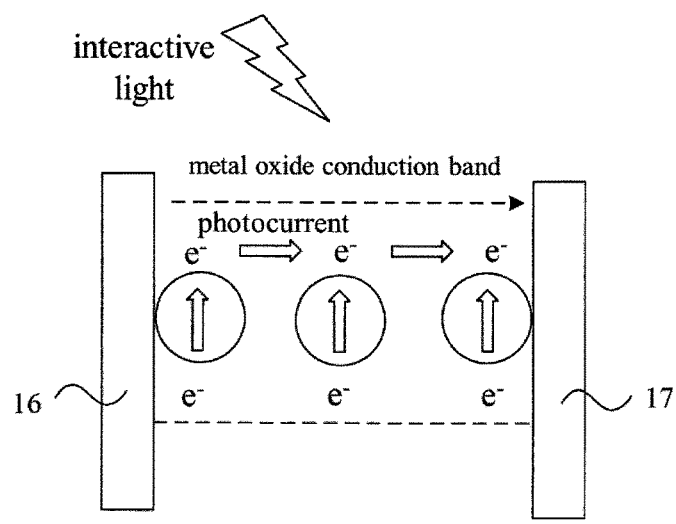
FIG. 5 is a schematic diagram of photocurrent formed when a quantum dot layer in the display panel provided by an embodiment of the application is irradiated by light.

The quantum dot layer 20 is in direct contact with the metal oxide active layer 14 and is positioned on at least one of an upper side or a lower side of the metal oxide active layer 14. The metal oxide active layer 14 has a relatively wide bandwidth, so it cannot absorb visible light but can only absorb ultraviolet light with a shorter wavelength. The quantum dot layer 20 has a relatively narrow bandwidth, so it can absorb visible light and near-infrared light with longer wavelengths. As shown in FIG. 5, when the quantum dots absorb the interactive light with a longer wavelength, electrons of the quantum dots transit from a valence band to a conduction band. Because the quantum dot layer 20 and the metal oxide active layer 14 are in contact with each other, the electrons transiting to the conduction band can be injected into the conduction band of the metal oxide active layer 14. Under an action of a bias voltage, a photocurrent can be formed between the source 16 and the drain 17 of the light-sensing transistor T1, which means that the light intensity signal is converted into the electrical signal.

In the present application, the quantum dot layer 20 and the metal oxide active layer 14 are combined in the light-sensing transistor T1 of the light-sensing circuit. Under a premise of ensuring higher electron mobility and stability, absorption of the visible light and the near-infrared light with longer wavelengths is realized. In this way, the display panel with a remote light touch function can be constructed, which greatly increases an interactive performance and added value of the display panel.

In an embodiment, the quantum dot layer 20 includes cadmium selenide quantum dots, but is not limited to this, and can be other types of quantum dots.

In an embodiment, the light-sensing transistor T1 is the top gate structure. Material of the gate layer includes a transparent conductive material, so the interactive light can be irradiated through a transparent gate into the quantum dot layer 20. In this way, the quantum dot layer 20 absorbs more light-slight and accordingly generates a larger electrical signal, so the light-sensing transistor T1 is easier to be turned on, which increases a sensitivity of a detection.

In an embodiment, material of the metal oxide active layer 14 includes at least one of indium-tin oxide, indium-zinc oxide, indium-gallium-zinc oxide, indium-zinc-tin oxide, or indium-gallium-zinc-tin oxide.

In an embodiment, a projection of the metal oxide active layer 14 on the substrate 11 is positioned in a projection of the quantum dot layer 20 on the substrate 11, which means that an area of the quantum dot layer 20 is greater. After the quantum dots absorb the interactive light, the electrons in the quantum dots transit from the valence band to the conduction band as much as possible. The electrons transiting to the conduction band can also be injected into the conduction band of the metal oxide active layer 14 as much as possible and accordingly generates a larger electrical signal, so the light-sensing transistor T1 is easier to be turned on, which increases the sensitivity of the detection.

Figure 3:
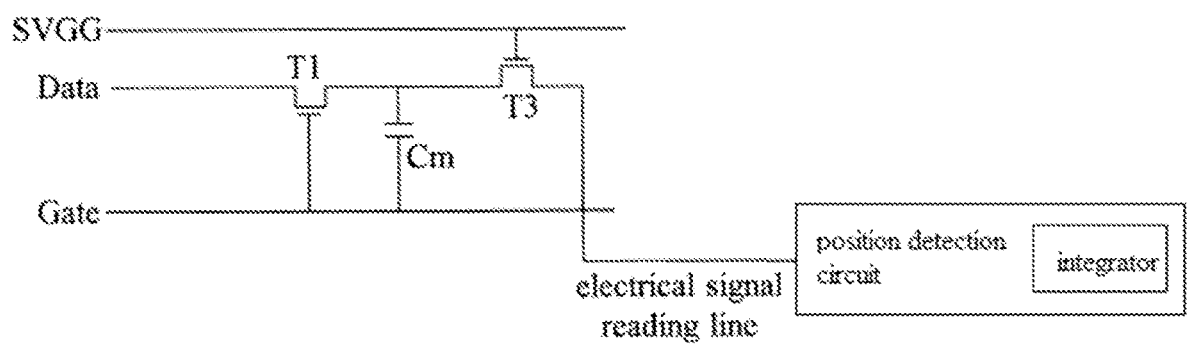
FIG. 3 is a second structural schematic diagram of the light-sensing circuit in the display panel provided by an embodiment of the present application.

As shown in FIG. 3, which is a second structural schematic diagram of the light-sensing circuit in the display panel provided by an embodiment of the present application, the light-sensing circuit includes the light-sensing transistor T1, a second switching transistor T3, and a storage capacitor Cm. The gate of the light-sensing transistor T1 is connected to the scan signal line Gate. The first electrode of the light-sensing transistor T1 is connected to a first data signal line Data. The second electrode of the light-sensing transistor T1 is connected to a first electrode of the second switching transistor T3. A gate of the second switching transistor T3 is connected to a second data signal line SVGG. A second electrode of the second switching transistor T3 is connected to the electrical signal reading line. A first plate of the storage capacitor Cm is connected to the first data signal line Data. A second plate of the storage capacitor Cm is connected to the gate of the light-sensing transistor T1. The electrical signal reading line is connected to the position detection circuit. Among the first electrode and the second electrode of each of these transistors, one is the source and the other is the drain.

When the light-sensing circuit is working, the scan signal line Gate inputs a negative voltage to the gate of the light-sensing transistor T1, and the first data signal line Data inputs a first data signal to the first electrode of the light-sensing transistor T1. When there is no light irradiating, the light-sensing transistor T1 is turned off, an electric charge in the storage capacitor Cm does not change. After the interactive light source emits the interactive light, the interactive light is irradiated on the light-sensing transistor T1, the light-sensing transistor T1 is turned on, the first electrode of the second switching transistor T3 receives the first data signal input from the first data signal line Data, and the electric charge in the storage capacitor Cm also changes, which stores the first data signal. The gate of the second switching transistor T3 is connected to the second data signal line SVGG. The second data signal line SVGG inputs a second data signal into the display panel row by row or column by column. When the second data signal corresponding to the light-sensing circuit is at a high electric potential, the second switch transistor T3 is turned on, and the electrical signal reading line can read a voltage value of the second data signal. The electrical signal reading line is connected to the position detection circuit, so that the position detection circuit can determine the position of the interactive light according to the voltage value read by the electrical signal reading line.

In the light-sensing circuit, a structure of the light-sensing transistor T1 is same as that in FIG. 2, and a working principle after being irradiated is also the same.

The display panel of the present application can be a liquid crystal display panel or an organic light-emitting diode (OLED) display panel. In an embodiment, the display panel includes an array substrate, and the light-sensing circuit is disposed in the array substrate. The light-sensing circuit and a pixel driving circuit for driving pixels to emit light are both arranged in the array substrate, but the two are independent circuits and work independently of each other during operation.

In an embodiment, a light-sensing layer is formed with a plurality of light-sensing circuits. The light-sensing layer is disposed on a light-emitting surface of the display panel and is electrically connected to the display panel. The light-sensing layer is an external-mounted structure, and the plurality light-sensing circuits are integrated on a glass substrate to form the light-sensing layer, which is disposed on the light-emitting surface of the display panel. This arrangement is easy to be replaced when the light-sensing layer fails, and the light-sensing layer can be installed or not installed according to requirements of the remote light touch function, and it can be removed in a scene where the remote light touch function is not required, which can reduce a thickness of the display panel.

In the above embodiments, a configuration of the quantum dot layer 20 realizes the interaction with the light with a longer wavelength. In addition, the same effect can be realized by disposing an up-conversion material layer.

In an embodiment, the display panel includes the plurality of light-sensing regions 100. The display panel includes an up-conversion material layer, light-sensing circuit, and the position detection circuit. The up-conversion material layer is configured to absorb the interactive light emitted by the interactive light source and convert a first waveband into a second waveband of the interactive light. A range of the second waveband is less than a range of the first waveband. The light-sensing circuit is disposed in each of the light-sensing regions 100. Each light-sensing circuit includes the light-sensing transistor. The light-sensing transistor includes the substrate, the metal oxide active layer, the gate insulating layer, the gate layer, and the source/drain layer. The up-conversion material layer is disposed between the interactive light source and the metal oxide active layer. The range of the second waveband is within a range of an absorption waveband of the metal oxide active layer. The light-sensing transistor is configured to convert the light intensity signal of the interactive light into the electrical signal. The position detection circuit is configured to determine the irradiation position of the interactive light according to the electrical signal.

In this embodiment, both the light-sensing circuit and the position detecting circuit can adopt the two structures shown in FIG. 2 and FIG. 3, which have the same working principle. A difference from the foregoing embodiment is only in the structure of the light-sensing transistor T1.

In an embodiment, the up-conversion material layer is disposed in the light-sensing transistor T1 and is disposed on a side of the metal oxide active layer 14 away from the substrate 11.

In an embodiment, the light-sensing transistor T1 is the bottom gate structure. The light-sensing transistor T1 includes the substrate 11, the gate layer, the gate insulating layer 13, the metal oxide active layer 14, and the source/drain layer, which are stacked. The gate layer is patterned to form the gate 12 of the light-sensing transistor T1. The source/drain layer is patterned to form the source 16 and the drain 17 of the light-sensing transistor T1. The up-conversion material layer is disposed on the metal oxide active layer 14.

In an embodiment, the light-sensing transistor T1 is a top gate structure. The light-sensing transistor T1 includes the substrate 11, the metal oxide active layer 14, the gate insulating layer 13, the gate layer, the interlayer insulating layer 15, and the source/drain layer, which are stacked. The gate layer is patterned to form the gate 12 of the light-sensing transistor T1. The source/drain layer is patterned to form the source 16 and the drain 17 of the light-sensing transistor T1. The up-conversion material layer is disposed between the metal oxide active layer 14 and the gate insulating layer 13. In addition, the up-conversion material layer can be disposed on a side of the gate layer away from the gate insulating layer 13.

The up-conversion material layer is configured to absorb the interactive light emitted by the interactive light source and convert the first waveband into the second waveband of the interactive light. The range of the second waveband is less than the range of the first waveband and is within the range of the absorption waveband of the metal oxide active layer 14.

The up-conversion material layer can perform up-conversion luminescence, essentially anti-Stokes luminescence, which means that materials are excited by low-energy light and emit high-energy light. With an excitation with a long wavelength and a low frequency light, the materials emit light with a short wavelength and a high frequency.

Up-conversion materials include up-conversion nanoparticles, which are doped with rare earth elements. Depending on a doping of the rare earth elements, light in a 450-650 nm waveband can be converted into light in a 300-400 nm waveband, or light in an 808 nm waveband can be converted into light in a 550 nm waveband, or other high waveband light can be converted into light in a 400-500 nm waveband. An external infrared light waveband (780-980 nm) can be converted into light in a sensitive waveband (300-400 nm) of the metal oxide active layer 14 by utilizing characteristics of the up-conversion materials, thereby enhancing responses of the metal oxide active layer 14 to the visible light and the infrared light.

In the present application, the up-conversion material layer includes the up-conversion nanoparticles doped with lanthanides, and specifically, includes $NaYF_4$: Yb, Tm, Er. A mass fraction of Yb is 25%, a mass fraction of Tm is 0.5%, and a mass fraction of Er is 0.1%. When forming the up-conversion material layer, the above particles are first mixed in polymethyl methacrylate (PMMA) and are followed by solution spin coating method, and a film is formed by photopolymerizing a polymer. The film formed by the present application is a full-surface film, but a shape and other properties of the film can also be patterned according to different requirements.

When the near-infrared light is irradiated on the up-conversion material layer, Yb element absorbs the near-infrared light, and its energy transits to a higher energy level. Then the energy of the Yb transits to a higher energy level on Tm element or Er element and respectively transits from the energy level of each of the elements back to a ground state. A process of transiting back to the ground state respectively releases the ultraviolet light or the visible light. In addition, if the visible light is irradiated on the up-conversion material layer, after the above transition process, the ultraviolet light can also be obtained. The up-conversion material layer is disposed between the interactive light source and the metal oxide active layer 14, the wavelength of the near-infrared light emitted by the interactive light source is the first waveband, the wavelength of the ultraviolet light converted by the up-conversion material layer is the second waveband, and a waveband range of the ultraviolet light is within range of the absorption waveband the metal oxide active layer 14, so the photocurrent can be formed in the metal oxide active layer 14, that is, the light intensity signal is converted into the electrical signal.

In the light-sensing transistor T1 of the light-sensing circuit in this embodiment, the up-conversion material layer is arranged between the interactive light source and the metal oxide active layer 14, so that the interactive light with a longer wavelength is converted into light with a shorter wavelength and then absorbed by the metal oxide active layer 14. Under a premise of ensuring higher electron mobility and stability, absorption of the visible light and the near-infrared light with longer wavelengths is realized. In this way, the display panel with the remote light touch function can be constructed, which greatly increases the interactive performance and the added value of the display panel.

In an embodiment, the projection of the metal oxide active layer 14 on the substrate 11 is positioned in the projection of the up-conversion material layer on the substrate 11, which means that an area of the up-conversion material layer is greater. The up-conversion material layer has a stronger ability to convert lights, so the metal oxide active layer 14 absorbs more lights and accordingly generates a larger electrical signal. As a result, the light-sensing transistor T1 is easier to be turned on, which increases the sensitivity of the detection.

In the above embodiments, the up-conversion material layer is disposed inside the light-sensing transistor T1, but is not limited to this. In an embodiment, the up-conversion material layer is disposed on the light-emitting surface of the display panel, and the up-conversion material layer converts the visible light or the near-infrared light with a longer wavelength into ultraviolet light with a shorter wavelength, so that the metal oxide active layer can absorb the ultraviolet light and convert its light intensity signal into the electrical signal.

Similarly, the display panel of the present application can be the liquid crystal display panel or the organic light-emitting diode (OLED) display panel. In an embodiment, the display panel includes the array substrate, and the light-sensing circuit is disposed in the array substrate. The light-sensing circuit and the pixel driving circuit for driving the pixels to emit light are both arranged in the array substrate, but the two are independent circuits and work independently of each other during operation.

In an embodiment, the light-sensing layer is formed with the plurality of light-sensing circuits. The light-sensing layer is disposed on the light-emitting surface of the display panel and is electrically connected to the display panel. The light-sensing layer is the external-mounted structure, and the plurality light-sensing circuits are integrated on the glass substrate to form the light-sensing layer, which is disposed on the light-emitting surface of the display panel. This arrangement is easy to be replaced when the light-sensing layer fails, and the light-sensing layer can be installed or not installed according to requirements of the remote light touch function, and it can be removed in the scene where the remote light touch function is not required, which can reduce the thickness of the display panel.

The present application further provides a display device including the display panel and a driving chip. The display panel includes any one of the above display panels. The display device of the present application disposes the quantum dot layer, which is in contact with the metal oxide active layer, in the light-sensing transistor to absorb the interactive light with a longer wavelength and convert its light intensity signal into the electrical signal, and followed by determining the irradiation position of the interactive light through the position detection circuit. Therefore, the interaction with the light with a longer wavelength can be realized, and the current technical problem of the narrow wavelength range of the interactive light is alleviated.

It can be known according to the above embodiments:

The present application provides the display panel and the display device. The display panel includes the plurality of light-sensing circuits and the position detection circuit. The plurality of light-sensing circuits are disposed in the display panel and are arranged in an array. Each of the plurality of light-sensing circuits includes the light-sensing transistor. The light-sensing transistor includes the substrate, the metal oxide active layer, the gate layer, the source/drain layer, and the quantum dot layer. The quantum dot layer is in contact with the metal oxide active layer. The quantum dot layer is configured to absorb the interactive light emitted by the interactive light source. The wavelength of the interactive light is greater than the maximum absorption wavelength of the metal oxide active layer. The light-sensing transistor is configured to convert the light intensity signal of the interactive light into an electrical signal. The position detection circuit is electrically connected to the light-sensing circuit and is configured to determine the irradiation position of the interactive light according to the electrical signal. The present application disposes the quantum dot layer, which is in contact with the metal oxide active layer, in the light-sensing transistor to absorb the interactive light with a longer wavelength and convert its light intensity signal into the electrical signal, and followed by determining the irradiation position of the interactive light through the position detection circuit. Therefore, the interaction with the light with a longer wavelength can be realized, and the current technical problem of the narrow wavelength range of the interactive light is alleviated.

In the above embodiments, the descriptions of the various embodiments are different in emphases, for contents not described in detail, please refer to related description of other embodiments.

The display panel and the display device provided by embodiments of the present application are described in detail above, and the description of embodiments above is only for helping to understand technical solutions of the present application and its core idea. Understandably, for a person of ordinary skill in the art can make various modifications of the technical solutions of the embodiments of the present application above. However, it does not depart from the scope of the technical solutions of the embodiments of the present application.

What is claimed is:

1. A display panel, comprising:
   a plurality of light-sensing regions arranged in an array;
   a light-sensing circuit disposed in each of the plurality of light-sensing regions, wherein the light-sensing circuit comprises a light-sensing transistor, the light-sensing transistor comprises a substrate, a metal oxide active layer, a gate layer, a gate insulating layer, a source/drain layer, and a quantum dot layer, the quantum dot layer is in contact with the metal oxide active layer, the quantum dot layer is configured to absorb interactive light emitted by an interactive light source, a wavelength of the interactive light is greater than a maximum absorption wavelength of the metal oxide active layer, and the light-sensing transistor is configured to convert a light intensity signal of the interactive light into an electrical signal; and
   a position detection circuit electrically connected to the light-sensing circuit and configured to determine an irradiation position of the interactive light according to the electrical signal, wherein the light-sensing circuit further comprises a first switching transistor;
a gate of the light-sensing transistor is connected to a scan signal line, a first electrode of the light-sensing transistor is connected to a power high electric potential signal line, and a second electrode of the light-sensing transistor is connected to a gate of the first switching transistor; and
a first electrode of the first switching transistor is connected to the power high electric potential signal line, a second electrode of the first switching transistor is connected to an electrical signal reading line, and the electrical signal reading line is connected to the position detection circuit.

2. The display panel according to claim 1, wherein the quantum dot layer comprises cadmium selenide quantum dots.

3. The display panel according to claim 1, wherein the light-sensing transistor comprises the substrate, the gate layer, the gate insulating layer, the metal oxide active layer, and the source/drain layer, which are stacked; and
the quantum dot layer is disposed on at least one of a side of the metal oxide active layer adjacent to the gate insulating layer or a side of the metal oxide active layer adjacent to the source/drain layer.

4. The display panel according to claim 1, wherein the light-sensing transistor comprises the substrate, the metal oxide active layer, the gate insulating layer, the gate layer, an interlayer insulating layer, and the source/drain layer, which are stacked; and
the quantum dot layer is disposed on at least one of a side of the metal oxide active layer adjacent to the substrate or a side of the metal oxide active layer adjacent to the gate insulating layer.

5. The display panel according to claim 4, wherein material of the gate layer comprises a transparent conductive material.

6. The display panel according to claim 1, wherein material of the metal oxide active layer comprises at least one of indium-tin oxide, indium-zinc oxide, indium-gallium-zinc oxide, indium-zinc-tin oxide, or indium-gallium-zinc-tin oxide.

7. The display panel according to claim 1, wherein a projection of the metal oxide active layer on the substrate is positioned in a projection of the quantum dot layer on the substrate.

8. The display panel according to claim 1, wherein the light-sensing circuit further comprises a second switching transistor and a storage capacitor;
a gate of the light-sensing transistor is connected to a scan signal line, a first electrode of the light-sensing transistor is connected to a first data signal line, and a second electrode of the light-sensing transistor is connected to a first electrode of the second switching transistor;
a gate of the second switching transistor is connected to a second data signal line, and a second electrode of the second switching transistor is connected to an electrical signal reading line; and
a first plate of the storage capacitor is connected to the first data signal line, a second plate of the storage capacitor is connected to the gate of the light-sensing transistor, and the electrical signal reading line is connected to the position detection circuit.

9. The display panel according to claim 1, wherein the position detection circuit comprises an integrator.

10. The display panel according to claim 1, wherein the display panel comprises an array substrate, and the light-sensing circuit is disposed in the array substrate.

11. The display panel according to claim 1, wherein a light-sensing layer is formed with a plurality of light-sensing circuits, and the light-sensing layer is disposed on a light-emitting surface of the display panel and is electrically connected to the display panel.

12. The display panel according to claim 1, wherein each of the plurality of light-sensing regions corresponds to one or more pixels.

13. The display panel according to claim 1, wherein the display panel comprises a liquid crystal display panel or an organic light-emitting diode (OLED) display panel.

14. A display device, comprising a display panel and a driving chip;
wherein the display panel comprises:
a light-sensing circuit disposed in each of a plurality of light-sensing regions, wherein the light-sensing circuit comprises a light-sensing transistor, the light-sensing transistor comprises a substrate, a metal oxide active layer, a gate layer, a gate insulating layer, a source/drain layer, and a quantum dot layer, the quantum dot layer is in contact with the metal oxide active layer, the quantum dot layer is configured to absorb interactive light emitted by an interactive light source, a wavelength of the interactive light is greater than a maximum absorption wavelength of the metal oxide active layer, and the light-sensing transistor is configured to convert a light intensity signal of the interactive light into an electrical signal; and
a position detection circuit electrically connected to the light-sensing circuit and configured to determine an irradiation position of the interactive light according to the electrical signal,
wherein the light-sensing circuit further comprises a first switching transistor;
a gate of the light-sensing transistor is connected to a scan signal line, a first electrode of the light-sensing transistor is connected to a power high electric potential signal line, and a second electrode of the light-sensing transistor is connected to a gate of the first switching transistor; and
a first electrode of the first switching transistor is connected to the power high electric potential signal line, a second electrode of the first switching transistor is connected to an electrical signal reading line, and the electrical signal reading line is connected to the position detection circuit.

15. The display device according to claim 14, wherein the quantum dot layer comprises cadmium selenide quantum dots.

16. The display device according to claim 14, wherein the light-sensing transistor comprises the substrate, the gate layer, the gate insulating layer, the metal oxide active layer, and the source/drain layer, which are stacked; and
the quantum dot layer is disposed on at least one of a side of the metal oxide active layer adjacent to the gate insulating layer or a side of the metal oxide active layer adjacent to the source/drain layer.

17. The display device according to claim 14, wherein the light-sensing transistor comprises the substrate, the metal oxide active layer, the gate insulating layer, the gate layer, an interlayer insulating layer, and the source/drain layer, which are stacked; and the quantum dot layer is disposed on at least one of a side of the metal oxide active layer adjacent to the substrate or a side of the metal oxide active layer adjacent to the gate insulating layer.

18. The display device according to claim 14, wherein the light-sensing circuit further comprises a second switching transistor and a storage capacitor;

a gate of the light-sensing transistor is connected to a scan signal line, a first electrode of the light-sensing transistor is connected to a first data signal line, and a second electrode of the light-sensing transistor is connected to a first electrode of the second switching transistor;

a gate of the second switching transistor is connected to a second data signal line, and a second electrode of the second switching transistor is connected to an electrical signal reading line; and a first plate of the storage capacitor is connected to the first data signal line, a second plate of the storage capacitor is connected to the gate of the light-sensing transistor, and the electrical signal reading line is connected to the position detection circuit.

\* \* \* \* \*